United States Patent [19]
Chilluffo

[11] 4,025,873
[45] May 24, 1977

[54] BROADBAND, MICROWAVE, TWO-STAGE, STAGGER-TUNED, FIELD EFFECT TRANSISTOR AMPLIFIER

[75] Inventor: Ronald L. Chilluffo, Springfield, Va.

[73] Assignee: The United States of America as represented by the Secretary of the Navy, Washington, D.C.

[22] Filed: Aug. 17, 1976

[21] Appl. No.: 715,083

[52] U.S. Cl. .................................. 330/35; 330/21; 330/31; 330/53; 330/56
[51] Int. Cl.² ............................................ H03F 3/16
[58] Field of Search ............... 330/21, 31, 35, 53, 330/56; 333/84 M, 10; 325/485, 488, 489

[56] References Cited
UNITED STATES PATENTS

| | | | |
|---|---|---|---|
| 3,296,545 | 1/1967 | Hicks et al. | 330/21 |
| 3,569,850 | 3/1971 | Wegener | 330/56 |

*Primary Examiner*—Rudolph V. Rolinec
*Assistant Examiner*—Lawrence J. Dahl
*Attorney, Agent, or Firm*—R. S. Sciascia; Philip Schneider; David G. Rasmussen

[57] ABSTRACT

A microwave-integrated-circuit amplifier provides a broadband response in the region of 1–10 GHz. The amplifier includes: a microstrip which provides distributed circuit values for tuning; first and second microwave FETs included in the microstrip and tuned to the upper and lower cutoffs of the bandwidth, respectively; and a non-reciprocal microwave isolator which passes a signal in only one direction and is connected between the first and second microwave FETs.

6 Claims, 2 Drawing Figures

TWO-STAGE STAGGER TUNED AMPLIFIER

BROADBAND, MICROWAVE, TWO-STAGE, STAGGER-TUNED, FIELD EFFECT TRANSISTOR AMPLIFIER

BACKGROUND OF THE INVENTION

1. Field of the Invention

This invention relates to a broadband amplifier for the region of 1–10 GHz. The amplifier is fabricated from a pair of stagger-tuned, microwave, field-effect transistors (FET) incorporated in a microwave-integrated-circuit.

2. Description of the Invention

Microwave FETs which operate in the region of 1–10 GHz have been recently developed. These devices, when utilized in microwave-integrated-circuit (MIC) amplifiers, show promise for replacing some types of traveling wave tubes and other microwave-frequency devices. Up to this time, MIC amplifiers have used one or more cascaded microwave FETs in a microstrip medium with each microwave FET uniformly tuned to cover the same bandwidth. In order to obtain the uniformly tuned result, extremely sensitive tuning circuits are needed. A problem with this has been that a microstrip contains distributed circuit elements (i.e., characteristic impedance, inductance, and capacitance result from transmission line characteristics) for which only limited circuit values may be obtained. This severely restricts tuning and has led to complexity of the amplifier circuitry, thus affecting production capability in both performance and cost. In addition, the realizable gain-bandwidth product of a cascaded MIC amplifier using the uniformly tuned FET stages is not optimum due to these circuit value limitations.

What is needed is an MIC amplifier using cascaded FET stages which has a simple, realizable structure and will increase the bandwidth of the amplifier while maintaining maximum gain and a flat response.

SUMMARY OF THE INVENTION

The present invention provides such an MIC amplifier which, in general, uses two cascaded FETs which are stagger-tuned to the high and low ends of the desired bandwidth. The MIC amplifier includes a microstrip medium which provides the distributed circuit values for tuning. First and second microwave FETs are included in the microstrip and tuned to the upper and lower cutoffs of the bandwidth respectively. A non-reciprocal microwave isolator which passes a signal in only one direction, from the first to the second microwave FET, is connected between the first and second microwave FETs.

The novel feature of the present invention is the optimized circuit configuration of the elements of the MIC for stagger-tuning the unique circuit Q-characteristics of the two microwave FETs to the upper and lower cutoffs of the bandwidth under the constraint of the attainable microstrip distributed circuit element values. This provides improved realizable gain-bandwidth product with optimum gain and a flat response. The invention involves the recognition, when considered in view of the tuning restriction imposed by the distributed circuit element values of the microstrip, that there are unique Q- characteristics of the microwave FET which match well with the distributed circuit values of the microstrip over an extended bandwidth. This results in optimized gain performace of FET stages of the amplifier which, when combined in a stagger-tuning arrangement, provide an improved MIC amplifier.

An object of the invention is to provide an MIC amplifier having improved bandwidth with no loss of gain and implemented in a manner providing reduced component sensitivities for manufacturing purposes.

Another object of the invention is to provide an MIC amplifier having stagger-tuned FETs.

BRIEF DESCRIPTION OF THE PREFERRED EMBODIMENT

Figure 1:
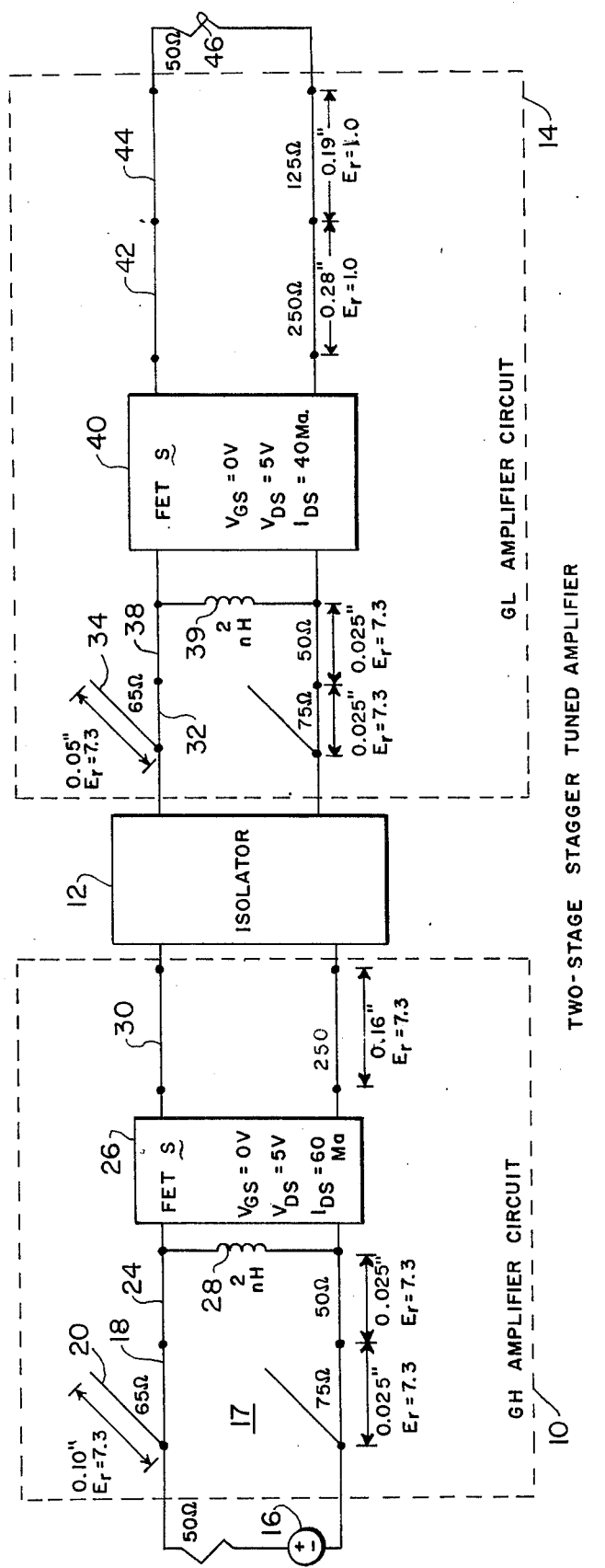
FIG. 1 is a schematic of an MIC amplifier utilizing two cascaded stagger-tuned FETs in a microstrip medium.

An MIC amplifier fabricated from a pair of stagger-tuned microwave FETs incorporated in a microstrip medium is shown in FIG. 1. Generally, the amplifier includes: a first amplifier stage 10 which incorporates a first microwave FET and is tuned to the upper cutoff of the desired bandwidth; an isolator 12, which propagates energy in only one direction; and a second amplifier stage 14 which incorporates a second microwave FET and is tuned to the low end to the desired bandwidth.

Looking at the MIC amplifier more closely, the input is provided by a voltage source 16 which has a 50 ohm internal impedance (shown in series with voltage source 16). The input is provided to the terminals of microstrip 17 which consists of transmission lines, open circuited stubs, and inductances which will be described subsequently. Microstrip 17 begins with transmission line 18 which is 0.25 inches long, has an effective relative dielectric constant (Er) equal to 7.3, and an impedance of 75 ohms. Located at the input terminals of transmission line 18 is an open-circuited stub 20, which is 0.1 inches long, has an Er = 7.3, and an impedance of 65 ohms. This stub acts as a capacitive element in the distributed circuit.

Transmission line 18 connects to a second transmission line 24 which is 0.025 inches long, has an Er = 7.3, and has an impedance of 50 ohms. The combined impedance characteristics of transmission lines 18, 20 are needed to provide the desired impedance at this point of the circuit. The output of transmission line 24 is connected to microwave FET 26, a Fairchild M.O.D. FMT 9000. A 2 nH inductance 28 is included across the input terminals of FET 26. The output of FET 26 is connected across a transmission line 30 which is 0.16 inches long, has an Er = 1.0, and an impedance of 250 ohms.

The output of transmission line 30 connects to nonreciprocal isolator 12 which will pass a signal in one direction but will dissipate a signal in the other direction. An example of such an isolator is a Western Microwave Labs PMI-2210. The isolator allows a signal to pass in the direction of second amplifier stage 14 and, specifically, to the input terminals of transmission line 32 which is 0.025 inches long, has an Er = 7.3, and an impedance of 75 ohms. Also connected to the input of transmission line 32 is an open-circuited stub 34, which is 0.05 inches long, has an Er = 7.3, and an impedance of 65 ohms. This stub also acts as a capacitive element in the distributed circuit.

Transmission line 32 connects to transmission line 38 which is 0.25 inches long, has an Er = 7.3, and an impedance of 50 ohms. The output is connected to the input of microwave FET 40 which may be the same as FET 26. Connected across the input terminals of microwave FET 40 is an inductance of 2 nH. FET 40 is tuned to the lower edge of the desired bandwidth.

The output terminals of FET 40 are connected across a transmission line 42 which is 0.28 inches long, has an Er = 1, and has a impedance of 250 ohms. Transmission line 42 feeds into transmission line 44 which is 0.19 inches in length, has an Er = 1.0, and an impedance of 125 ohms. Transmission line 44 is the final circuit element and feeds into a 50 ohm load 46 which constitutes the output.

It should be noted that first amplifier stage 10 could be tuned to the lower-cutoff of the bandwidth and the second amplifier stage 14 tuned to the upper-cutoff. This would be equivalent to the arrangement described in detail hereinbefore. It should further be noted that both first and second amplifier stages 10, 14 may use multiple microwave FETs to accomplish the same result as single microwave FETs 26, 40.

Figure 2:
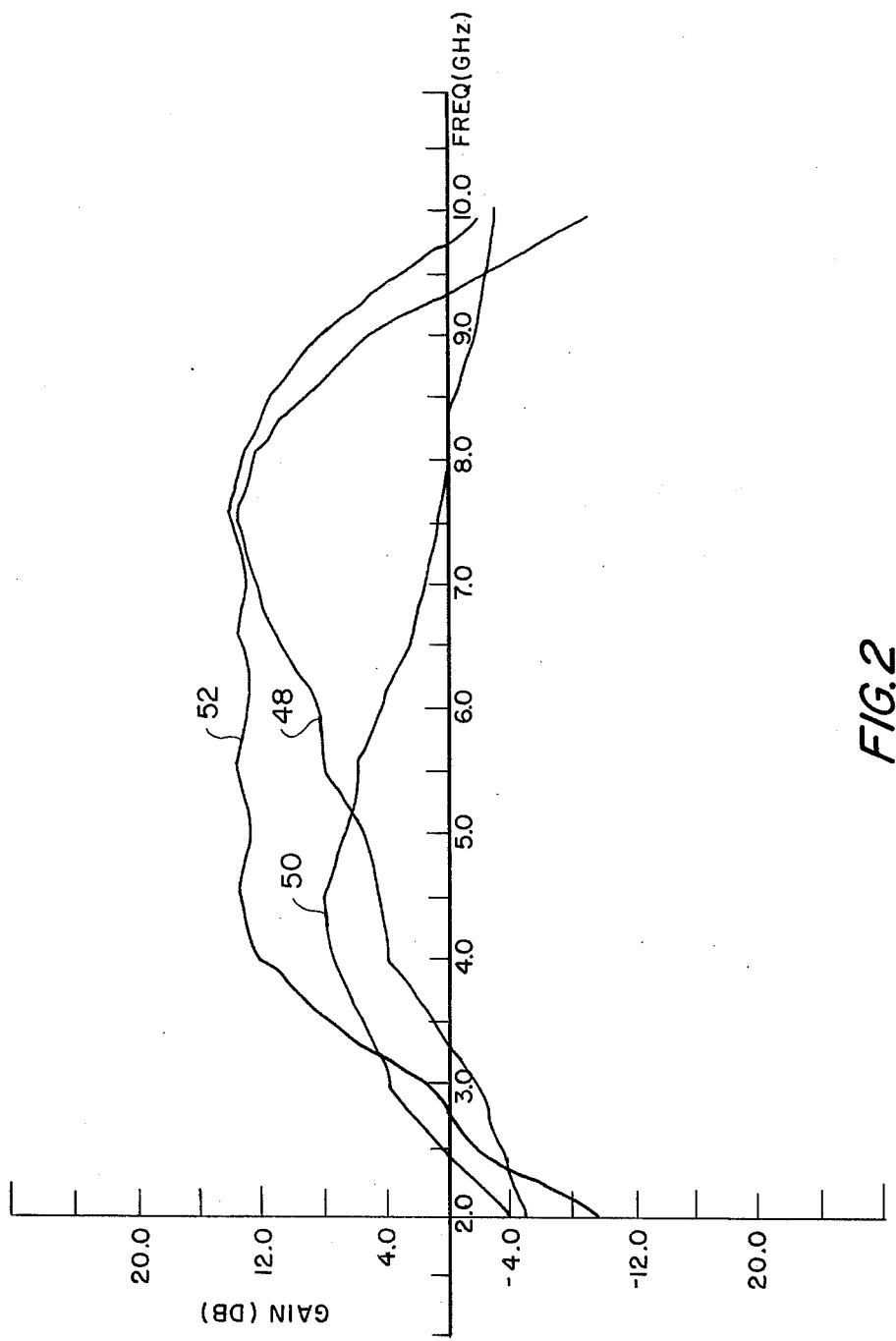
FIG. 2 is a diagrammatic representation of the frequency responses of the FETs tuned to the high and low cutoff points of the bandwidth and the resultant frequency response of the MIC amplifier.

FIG. 2 shows the frequency responses of the first and second amplifier stages tuned to the upper and lower edges of the bandwidth, respectively, and the resultant frequency response for the MIC amplifier. Curve 48 is the frequency response for first amplifier stage 10. The amplifier provides maximum gain at the upper edge of the bandwidth. Curve 50 is the frequency response for the second amplifier stage 14 which has a maximum gain at the lower end of the bandwidth. Curve 52 shows the resultant frequency response for the MIC amplifier which has flat gain across the entire bandwidth.

In operation, the microwave signal to the amplifier, as for example from a generator or antenna, is applied to the terminals of transmission line 18 shown in FIG. 1. After passing through transmission line 18, the signal passes through transmission line 24 to the input terminals of FET 26. Open-circuited stub 20, transmission lines 18, 24, shunt inductance 28, and transmission line 30 tune FET 26 to provide maximum gain at the high end of the bandwidth. First amplifier stage 10 amplifies the signal and obtains a response as seen in curve 48 of FIG. 2 with the optimum gain at the upper-cutoff point of the band-width. The signal is then passed to isolator 12 which in turn passes the signals to transmission lines 32, 38 and to FET 40. Isolator 12 passes signals only in the forward direction. This prevents reflected signals on transmission lines 32, 38 from passing back to FET 26.

FET 40 is tuned by open-circuited stub 34, inductance 39, transmission lines 32, 38, 42, 44 and has a response curve as seen in curve 50 of FIG. 2 with the optimum gain at the lower-cutoff of the bandwidth. Second amplifier stage 14 amplifies the signal previously amplified by first amplifier stage 10 and the resultant response is seen in curve 52 of FIG. 2. The resultant response has a bandwidth as wide as the responses of FETs 26, 40 with the total gain of both stages utilized and a flat response resulting. The flatness of the response may be fine-tuned by adjusting the gain of either FET 26 or 40. The output of FET 40 is fed through transmission lines 42, 44 to a load resistance 46 which constitutes the output.

As stated hereinbefore, MIC amplifiers using cascaded uniformly tuned FETs on a microstrip medium have been recently developed. However, due to the severe tuning restrictions imposed by the use of distributed circuit values in the microstrips, there is nothing that would indicate that an improvement in bandwidth, with no resultant decrease in gain, would occur from stagger-tuning FET stages. The invention involves the recognition that certain unique Q-characteristics of microwave FETs match well with the distributed circuit values of the microstrip, thus generating optimized amplifier stages which are stagger-tuned to provide the improved amplifier.

The unique Q-characteristics of the microwave FET consist of: a high reactance-to-resistance ratio in the FET input, which is a series configuration, thus giving a high Q; and a high resistance-to-reactance ratio in the FET output circuit, which is a parallel configuration, thus giving a high Q. Furthermore the reactance, resistance, and Q values needed for the MIC amplifier are only found in the microwave FET.

Broadband MIC FET amplifiers allow important advantages relative to existent, thermionic, traveling-wave-tube (TWT) amplifiers used in present electronic warfare systems. The MIC FET amplifier can provide: broadband high-gain amplification in small size/weight/volume; increased reliability; reduced power requirement; and lower production costs. These broadband amplifiers are used in electronic countermeasures, electronic support measures, and electronic reconnaissance system applications.

Obviously many modifications and variations of the present invention are possible in light of the above teachings. It is therefore to be understood that within the scope of the appended claims the invention may be praticed otherwise than as specifically described.

What is claimed and desired to be secured by letters patent of the United States is:

1. A microwave integrated circuit amplifier for amplifying a wide bandwidth in the microwave region comprising:

microstrip means for providing distributed circuits for tuning;

first microwave FET means, including at least one microwave FET, connected to said microstrip and tuned by said microstrip to the upper cutoff of said bandwidth for providing a high-gain frequency response at the upper cutoff region of said bandwidth;

second microwave FET means, including at least one microwave FET, connected to said microstrip and tuned by said microstrip to the lower cutoff of said bandwidth for providing a high-gain frequency response at the lower cutoff region of said bandwidth; and microstrip isolator means connected to said microstrip and further connected between said first and second microwave FET means for passing a signal in only one direction between said first and second microwave FET means.

2. The apparatus of claim 1 in which said first microwave FET means includes a single microwave FET.

3. The apparatus of claim 1 in which said second microwave FET means includes a single microwave FET.

4. A method for obtaining wide bandwidth amplification of a microwave signal with a microwave-integrated-amplifier comprising the steps of:

amplifying said microwave signal with a first microwave FET tuned, by means of distributed circuits of a microstrip, to the upper cutoff region of said bandwidth;

amplifying said first amplified microwave signal with a second microwave FET tuned, by means of distributed circuits of a microstrip, to the lower cutoff region of said bandwidth; and providing isolation between said first and second microwave FET by a microwave isolator which passes signals in only one direction from the first to the second microwave FET.

5. A method for obtaining a wideband microwave response from a microwave-integrated-amplifier comprising the steps of:

tuning a first microwave FET, by means of distributed circuit elements of a microstrip, to the lower-cutoff region of said bandwidth;

tuning a second microwave FET, by means of distributed circuit elements of a microstrip, to the upper-cutoff region of said bandwidth; and providing isolation between said first and second microwave FETs by a microwave isolator which passes signal in only one direction from the first to the second microwave FETs.

6. The apparatus of claim 1 in which said microstrip includes:

a first pair of serial transmission line means connected to the input of said first microwave FET means, for providing the necessary input impedance for tuning said first microwave FET means to the upper-cutoff of said bandwidth;

a second pair of serial transmission line means connected to the input of said second microwave FET means for providing the necessary input impedance for tuning said second microwave FET means to the lower-cutoff of said bandwidth;

a third pair of serial transmission line means connected to the output of said second microwave FET means for providing the necessary output impedance for tuning said second microwave FET means to the lower-cutoff of said bandwidth.

* * * * *